US 6,600,138 B2

(12) United States Patent
Hauf et al.

(10) Patent No.: US 6,600,138 B2
(45) Date of Patent: Jul. 29, 2003

(54) RAPID THERMAL PROCESSING SYSTEM FOR INTEGRATED CIRCUITS

(75) Inventors: Markus Hauf, Fremont, CA (US); Sing-Pin Tay, Fremont, CA (US); Yao Zhi Hu, San Jose, CA (US)

(73) Assignee: Mattson Technology, Inc., Fremont, CA (US)

(*) Notice: Subject to any disclaimer, the term of this patent is extended or adjusted under 35 U.S.C. 154(b) by 0 days.

(21) Appl. No.: 09/836,098

(22) Filed: Apr. 17, 2001

(65) Prior Publication Data

US 2002/0148824 A1 Oct. 17, 2002

(51) Int. Cl.[7] .................................. F27B 5/14
(52) U.S. Cl. ................ 219/411; 219/390; 219/405; 118/724; 118/725; 118/50.1; 392/416
(58) Field of Search ................. 219/390, 405, 219/411; 118/724, 725, 50.1; 392/416, 418

(56) References Cited

U.S. PATENT DOCUMENTS

| 5,879,574 A | 3/1999 | Sivaramakrishnan et al. |
| 5,899,735 A | 5/1999 | Tseng |
| 5,963,840 A | 10/1999 | Xia et al. |
| 5,968,587 A | 10/1999 | Frankel |
| 6,021,152 A * | 2/2000 | Olsen et al. ........... 372/99 |
| 6,067,931 A | 5/2000 | Ghezzo et al. |
| 6,133,550 A | 10/2000 | Griffiths et al. |
| 6,343,183 B1 * | 1/2002 | Halpin et al. ........... 392/416 |

* cited by examiner

Primary Examiner—Teresa Walberg
Assistant Examiner—Shawntina T. Fuqua
(74) Attorney, Agent, or Firm—Connolly Bove Lodge & Hutz LLP (57) ABSTRACT

In a rapid thermal processing system an array of heat lamps generate radiant heat for heating the surfaces of a semiconductor substrate, such as a semiconductor wafer, to a selected temperature or set of temperatures while held within an enclosed chamber. The heat lamps are surrounded individually or in groups by one or more optically transparent enclosures that isolate the heat lamps from the chamber environment and the wafer or wafers therein. The optically transparent enclosures may include associated reflectors and/or lenses to direct a higher proportion of emitted radiant heat energy from the lamps toward the semiconductor wafer(s). Thin planar quartz liners may also be interposed between the lamps and the substrate. By controlling radiant energy distribution within the chamber, and eliminating thick planar quartz windows commonly used to isolate the lamps in prior art RTP systems, higher processing rates and improved reliability are obtained.

36 Claims, 6 Drawing Sheets

RAPID THERMAL PROCESSING SYSTEM FOR INTEGRATED CIRCUITS

BACKGROUND OF THE INVENTION

The present invention relates to the manufacture of integrated circuits. Specifically, a system for heating semiconductor substrates in a controlled pressure and temperature environment is disclosed.

The manufacture of integrated circuits, such as metal oxide semiconductors (MOS), requires rapid thermal processing of semiconductor wafers in a controlled pressure environment, such as vacuum. For instance, in the process of forming MOS transistors, the gate oxide layer is typically formed by thermal oxidation of a silicon substrate in a substantially pure oxygen atmosphere. However, in certain applications such as MOS ULSI circuits, the gate oxide layers can exhibit undesirable characteristics, such as relatively high defect densities and charge trapping, along with relatively low reliability and resistance problems due to hot carrier effects.

It is known that the gate dielectric characteristics of MOS transistors can be improved using a sequence of rapid thermal processing (RTP) of the silicon substrate. These processing steps include: (1) creating an oxynitride growth with nitric oxide (NO); (2) applying silicon nitride (SiN) with a chemical vapor deposition (CVD) process; (3) annealing with ammonia ($NH_3$); and (4) annealing with $N_2O$. The various RTP processing steps are conducted generally in a vacuum with a controlled temperature. An RTP oven is partitioned with quartz windows defining a central vacuum chamber that holds a wafer to be heated by multiple arrays of radiant heating lamps. The quartz windows separate the wafers from heating lamps and other sources of contaminants during the heating process. The edges of the quartz windows are sealed with the chamber walls to form an air-tight chamber enclosure. When a vacuum is drawn in the chamber, an atmospheric force between two and four tons is produced against the quartz windows. The quartz windows are thick enough to withstand this force, and are generally at least about 25 mm to 35 mm thick. Thinner quartz windows, generally at least about 3 mm to 6 mm thick, are used only for chambers that operate at atmospheric pressures.

The quartz window isolation chamber structure, while maintaining the inner chamber environment clean of contaminants, introduces a large thermal mass between the heating source (lamps) and the wafer within the chamber, making heating less efficient and wafer temperature control more difficult. The additional thermal mass makes it difficult to maintain process repeatability and quality control. The quartz windows, due to their thickness, are subject to breakage, and add significant cost to the RTP apparatus. Accordingly, a system for rapid thermal processing which avoids the complications, expense, and repeatability problems created by quartz window-based ovens would be desirable.

Moreover, efforts to increase throughput for semiconductor wafer RTP processing have yielded certain alternatives other than lamp-based heating. Mattson Technology offers an ASPEN II RTP system that processes two wafers in a single process chamber using susceptor-based heating. U.S. Pat. No. 6,133,550 discloses a method for RTP processing wafers by rapidly inserting and removing them from a furnace. Increasing wafer size and increasing stresses on larger and larger chamber windows for chambers to accommodate larger wafers have limited the potential for increasing throughput for lamp-based RTP systems by processing multiple wafers in a chamber. Accordingly, a system for lamp-based rapid thermal processing that permits increased wafer throughput would also be desirable.

SUMMARY OF THE INVENTION

The rapid thermal processing (RTP) system according to the invention provides a controlled pressure and temperature environment for processing substrates, such as semiconductor wafers and integrated circuits. The apparatus includes a heating chamber and an array of heat lamps that generate radiant heat for maintaining the temperature of a semiconductor wafer held within the chamber at a selected value or range of values according to a desired heating recipe. Each heat lamp includes a bulb, and at least such bulb is surrounded by an optically transparent enclosure that isolates the bulb from the interior of the chamber and the wafer therein. Preferably, the optically transparent enclosure is formed from quartz and has a surface completely or substantially transparent to the radiant heat energy emitted by the bulb. By isolating the chamber interior and the wafer therein from the bulb and associated components of the heating lamp, the optically transparent enclosure helps prevent contaminants from the heating lamps from entering the chamber or being deposited on a semiconductor wafer in the chamber.

In another aspect of the invention, improved temperature control is realized by using heat lamps with bulbs having a reflector surface disposed over at least a portion of the bulb surface or disposed over at least a portion of the optically transparent enclosure. The reflectors help to control and direct radiation from the lamps to the surface of a semiconductor wafer under process. Alternatively, the reflector surface may be found on the wall of the chamber, particularly within a cavity in the chamber wall with a concavely-shaped or parabolic-shaped inner surface. When the heat lamps are positioned within the cavity, the reflector surface on the cavity wall helps to control and direct radiation from the lamps to the surface of a semiconductor wafer under process.

In a preferred embodiment, the optically transparent enclosure surrounding the bulb is formed into a lens structure that concentrates the radiant heat emitted from the bulb onto the semiconductor wafer surface. The lens structure may be formed as a convexly-curved cover over the opening to the cavity in the chamber wall when the heat lamp is held within such cavity. Alternatively, the lens structure may be formed as a sold block or piece of optically transparent material, such as quartz, with an open inner core portion to house a heat lamp, wherein one side surface of said block is formed into a convexly-shaped or concavely-shaped lens to direct or control radiant heat energy emitted from the bulb toward a semiconductor wafer being processed.

In yet another embodiment of the invention, an optically transparent liner is interposed between an array of the enclosed heating lamps and the single wafer or multiple wafers in the processing chamber enclosure. The optically transparent liner is provided in addition to the optically transparent enclosures surrounding the bulbs, and further isolates the bulbs from the wafer to further restrict contaminants from reaching the wafer surface. The optically transparent liner differs from the quartz windows of the prior art because it is not sealed to the chamber sidewalls, and may therefore be formed as a thinner piece because it does not need to withstand great pressure differentials when a vacuum is drawn in the chamber. If the optically transparent liner is sealed to the chamber sidewalls, a series of valves are provided in addition to the pump to equalize the pressures of each side of the liner, thereby preventing damaging forces that otherwise would be caused by pressure differentials. Alternatively, to avoid undue stresses, a series of multiple optically transparent liners with smaller surface areas may also be used in combination with the bulbs.

Still other objects and advantages of the present invention will become readily apparent to those skilled in the art from the following detailed description of the preferred embodiments of the invention. As will be realized, the invention is capable of other and different embodiments, and its several details are capable of modifications in various obvious respects, without departing from the invention. Accordingly, the description is to be regarded as illustrative in nature and not as restrictive.

DESCRIPTION OF THE PREFERRED EMBODIMENT

Figure 1:
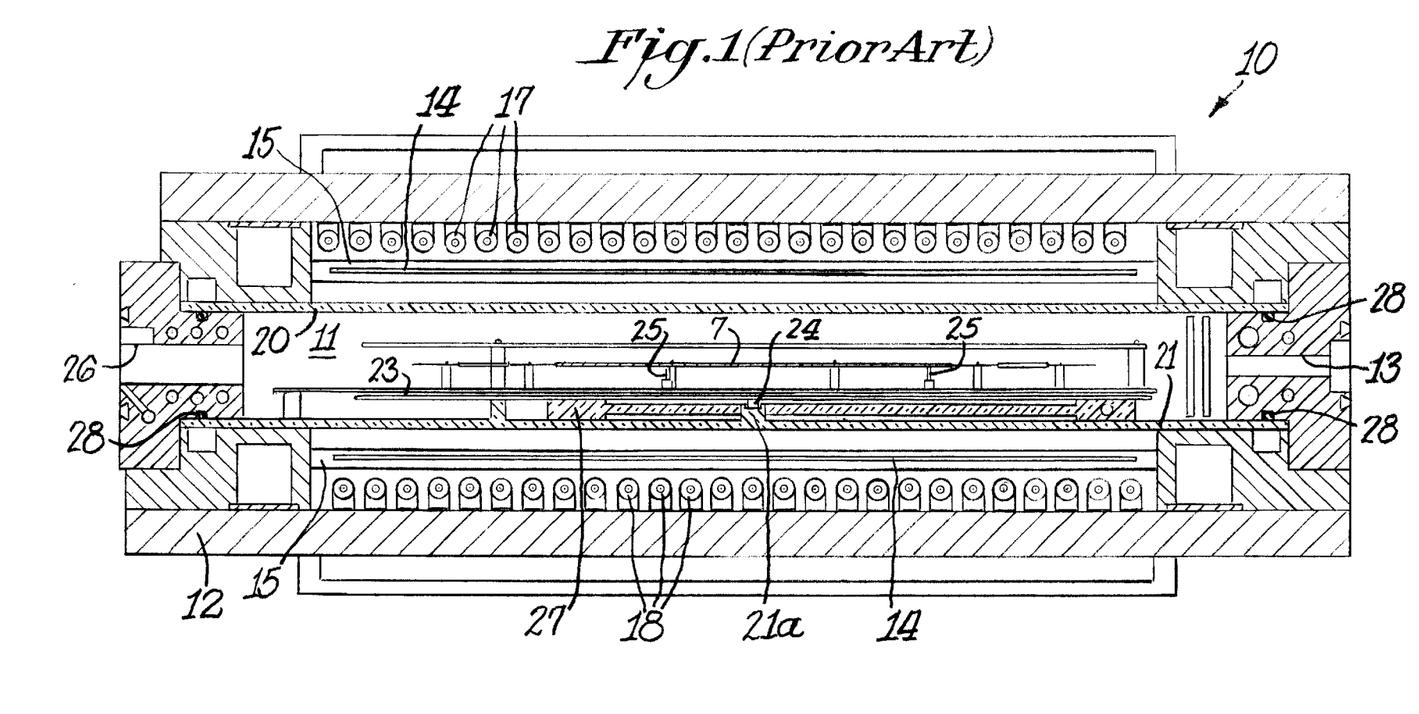
FIG. 1 illustrates a conventional prior art rapid thermal processing system providing a controlled temperature and pressure environment for semiconductor wafers.

In accordance with the prior art, FIG. 1 is a longitudinal section view of an apparatus 10 for performing rapid thermal processing (RTP) of a semiconductor wafer 7. The apparatus 10 provides a housing 12 defining a central chamber 11 in which a wafer is placed for processing. Door slot 26 at a first end of vacuum chamber 11 permits the wafer 7 to be loaded into the chamber 11 and located on supporting pins 25 on the rotor 23. The rotor 23 is supported for rotation on a pin 24 fixed to a boss 21a extending from quartz window 21 through an opening in quartz pad 27.

Quartz window 21 forms the lower boundary of the vacuum chamber 11, and is sealed with respect to the remaining chamber components by seals 28. The upper boundary of the chamber 11 is formed with a quartz window 20. Quartz windows 20, 21 are optically transparent and permit radiant heat energy to pass into the chamber 11. Processing gases such as nitric oxide (NO), ammonia ($NH_3$), or $N_2O$ are introduced into the chamber 11 during the wafer processing through an opening 13 at a second end of the chamber 11.

The radiant heat source for the apparatus 10 comprises first and second substantially parallel lamp arrays 17 and 18 located within the housing 12, but outside of the chamber 11, and supported by the inner walls of the apparatus 10. Additional radiant heat is provided by longitudinal side lamps 14 having reflectors 15 supported by the wall of the apparatus 10. A vacuum port (not shown) permits a vacuum to be drawn within the chamber 11, resulting in significant atmospheric forces acting against the quartz windows 20 and 21.

The quartz windows 20 and 21 have a sufficient thickness with adequate mechanical strength to isolate the chamber from any external contamination. They are usually at least 3 mm to 6 mm thick. As the demands for larger semiconductor wafer sizes and higher wafer throughput in the rapid thermal processing system increase, the cross sectional area increases. In addition, low pressure process chambers are required to be compatible with vacuum load-locks and wafer transfer modules to enhance throughput. The thickness of quartz windows 20 and 21 required for low pressure RTP apparatus will need to be significantly increased to meet these requirements. When a vacuum is drawn in the RTP chamber, an atmospheric force of between two and four tons is produced against the quartz windows. These windows must be thick enough to withstand this force, and are generally from 25 mm to 35 mm thick. As the thickness of the quartz windows increases, the distance between the arrays of heating lamps 17, 18 and the chamber 11 also increases. Moreover, the thicker windows provide a large thermal mass, making control over the wafer temperature more difficult. Therefore, the present inventors sought to overcome these disadvantages.

Figure 2:
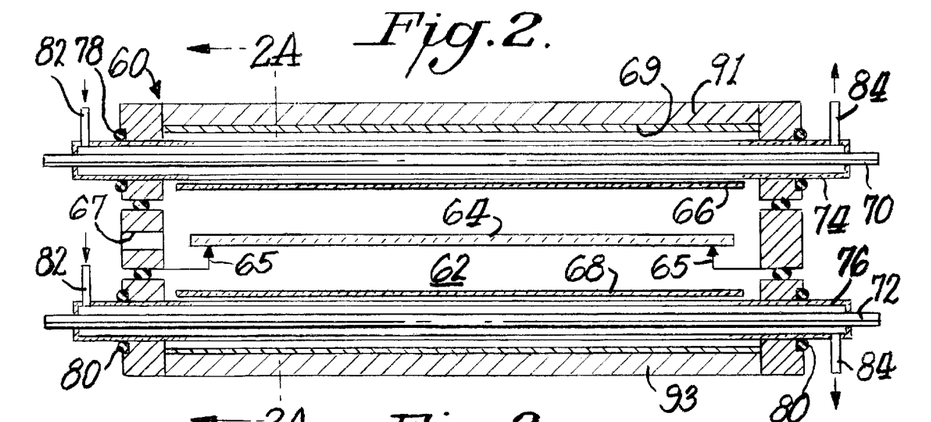
FIG. 2 is a section view of a rapid thermal processing system in accordance with a preferred embodiment of the invention.

In accordance with one preferred embodiment of the invention, the quartz windows 20, 21 of conventional RTP apparatus (FIG. 1) may be eliminated. Referring now to FIG. 2, the RTP apparatus 60 of the first embodiment of the invention has a chamber 62 that includes wafer holders 65 to support the semiconductor wafer 64 during thermal processing. Wafer 64 is loaded into the chamber 62 through a door slot or opening 67. Optically transparent liners 66 and 68, which may be quartz, do not form a pressure sealing surface with the chamber 62, but are supported within the chamber 62 so that the pressure is equalized on each side of the liners 66 and 68. Thus, the liners 66 and 68 may be thinner, and have less thermal mass, than the conventional chamber quartz windows that must sustain large atmospheric pressure differentials but still assist in maintaining the wafers free of contamination. The liners have a thickness preferably of about 0.25 mm to 2.0 mm, most preferably of about 1.0 to 2.0 mm, and may be formed of silicon carbide (SiC) or other ceramic materials that are optically transparent and able to withstand typical rapid thermal processing temperatures, that can exceed 1000° C.

Figure 2A:
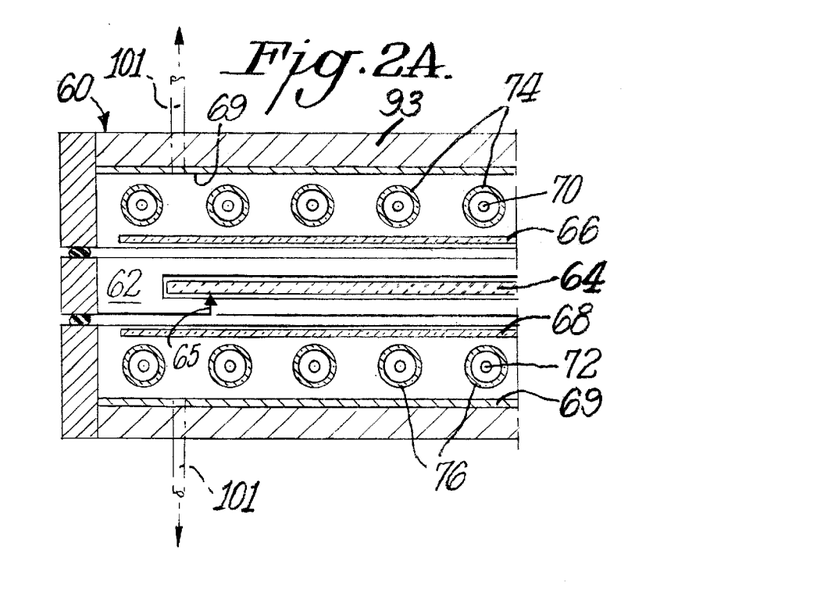
FIG. 2A is a partial cross-sectional view in side elevation taken along line 2A to 2A of FIG. 2.

In the embodiment of FIG. 2, first and second arrays of light sources, such as tungsten halogen heating lamps or Xenon arc lamps, are provided along the top and bottom of the chamber 62, i.e., above and below the wafer supports 65. The arrays of light sources along the top and bottom of the chamber 62 supply direct radiant heat to the wafer 64 as the wafer is held on the wafer supports 65. Each light source includes a linear lamp 70, 72 within an optically transparent enclosure (such as a quartz tube) 74, 76 on the top and bottom of chamber 62. The quartz tubes 74, 76 individually surround each lamp 70, 72, and are sealed to the sidewalls of chamber 62 with seals 78, 80, thus maintaining both the area surrounding the quartz tubes 74, 76 and the remaining portion of the chamber 62 at the same pressure, preferably under vacuum. The top and bottom walls 91, 93 of the chamber 62 may be coated with a reflective coating 69, such as metallic gold or other infrared reflective coatings, such as $TiO_2$ and $Al_2O_3$. As best seen in FIG. 2A, the lamps 70, 72 preferably are disposed in parallel relation, with each enclosed lamp spaced apart only slightly from an adjacent enclosed lamp, and spaced apart from the top wall and bottom wall, respectively, of the chamber and reflective coating 69. While each of the arrays are shown in parallel, it is of course possible to have the arrays oriented in a perpendicular or other non-parallel relationship. In addition, a first parallel array adjacent to the top wall 91 of the chamber may be parallel to a second parallel array adjacent to the bottom wall 93 of the chamber. Nevertheless, the lamps of the second parallel array may be arranged transversely to the lamps of the first parallel array.

Individual cooling channels having an inlet 82 and an outlet 84 circulate cooling fluid, such as a liquid like water or a cooling oil, or a gas with suitable thermal conductivity like air, or a mixture of air and helium or hydrogen, through each quartz tube 74, 76 to cool the lamps 70, 72. The cooling fluid may have light refractive properties, and the path of flow of the cooling fluid may be designed to direct radiant heat or light emitted from the lamp bulbs 70, 72 toward the semiconductor wafer 64.

As shown in FIGS. 2 and 2A, the chamber 62 has first and second arrays of quartz enclosures 74, 76, with each quartz enclosure containing a respective lamp 70, 72. The quartz enclosures 74, 76, and liners 66, 68, help to isolate the lamp bulbs from the chamber 62 so as to maintain the inner portion of the chamber 62 that houses the wafer during RTP processing free from contaminants without introducing large thermal masses between the light source(s) and the wafer.

Optional vacuum lines 101 may be used to evacuate gases from the chamber 62 to draw a vacuum within the chamber. The vacuum lines are shown in phantom outline in FIG. 2A.

Although not shown in FIG. 2, it is of course possible to use liners with different thicknesses to isolate the first and second lamp arrays from the chamber 62. For example, a thinner liner with a nominal thickness of 0.25 mm may be suitable to isolate the first lamp array, and may have the advantage of permitting a faster temperature response and higher temperature ramp up.

Figure 3:
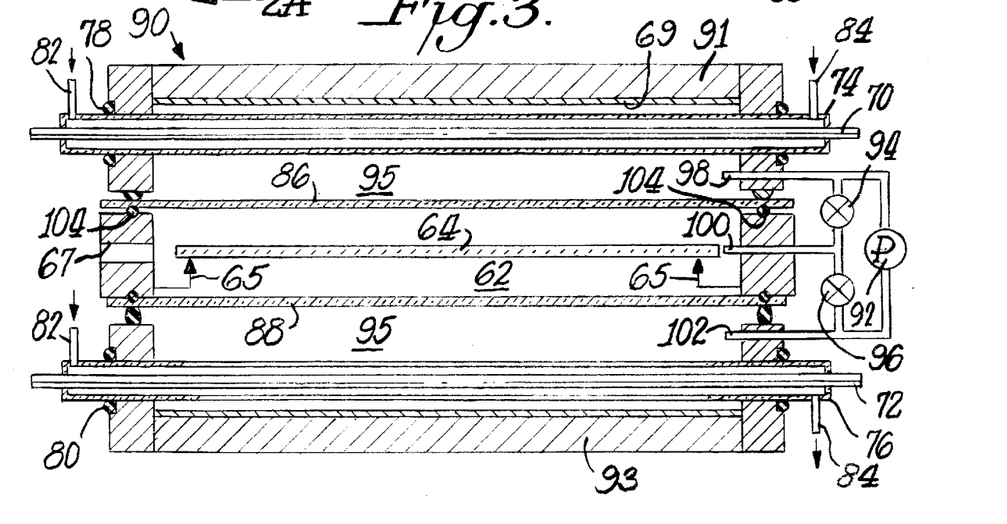
FIG. 3 is a section view of an alternate embodiment of the rapid thermal processing system.

FIG. 3 is a section view of an alternate embodiment 90 of the invention which provides for additional contamination protection for a wafer 64 supported on the wafer supports 65. In the embodiment of FIG. 3, windows 86 and 88 fully extend to the sides of the housing defining the chambers 62, 95 to form a sealed enclosure for the wafer supports 65 to better isolate the wafer 64 and wafer supports 65 from contaminants that might be emitted by the lamps 70, 72 or enclosures 74, 76 surrounding the lamps. To maintain pressure equilibrium on each side of the windows 86 and 88, thereby avoiding the need for thick and thermally massive quartz windows as were used in prior art RTP apparatus, the pressures on both sides of quartz windows 86 and 88 are controlled. In the embodiment shown in FIG. 3, a vacuum is drawn through pressure pump 92, and regulators 94 and 96 equalize the pressure on each side of the window plates 86 and 88 through conducting lines 98, 100 and 102. Appropriate seals 104 between the sidewalls of the chambers 62 and 95 and the windows 86, 88 maintain a substantially contaminant free environment under vacuum within the chambers 62 and 95.

Figure 4:
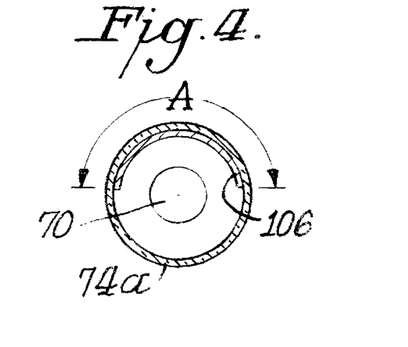
FIG. 4 is a section view of a heat lamp for directing radiant energy to a semiconductor wafer within the rapid thermal processing system.

As a further enhancement to the apparatus for rapid thermal processing, the amount of radiant energy delivered from the lamps 70, 72 to the chamber 62 containing the wafer 64 may be optimized by varying the characteristics of the envelope encompassing the lamp bulbs. FIG. 4 represents a section view of one of the transparent enclosures 74 from one of the lamp arrays 70. In this embodiment, the transparent enclosure is a quartz tube 74a that has been coated on an inner surface with a reflective coating 106 that helps to direct radiant energy from the bulb 70 to the wafer 64 on the wafer supports 65. Preferred reflective coating materials are gold, or other infrared reflective coatings, such as $TiO_2$ and $Al_2O_3$. The inner reflective coating 106 is shown covering less than 180° of the quartz tube 74a as defined by angle A in FIG. 4. Preferably, angle A is within the range of about 160 to 180°. By controlling the radiant energy intensity within the area in which the wafer is processed, improved temperature stability may be realized, resulting in better process repeatability.

Figure 5:
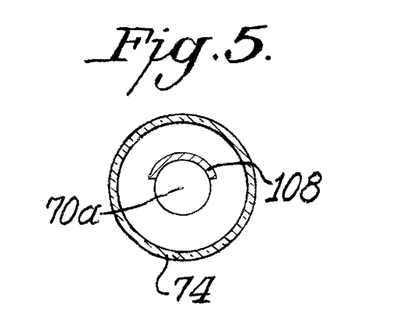
FIG. 5 is a section view of an alternate embodiment of the heat lamp for directing radiant energy to a semiconductor wafer within the rapid thermal processing system.

FIG. 5 is a section view of an alternative arrangement in which a reflective coating 108 is applied to the outside surface of a lamp bulb 70a to direct radiant energy towards the wafer held within the chamber 62.

Figures 6, 7, 8, 9:
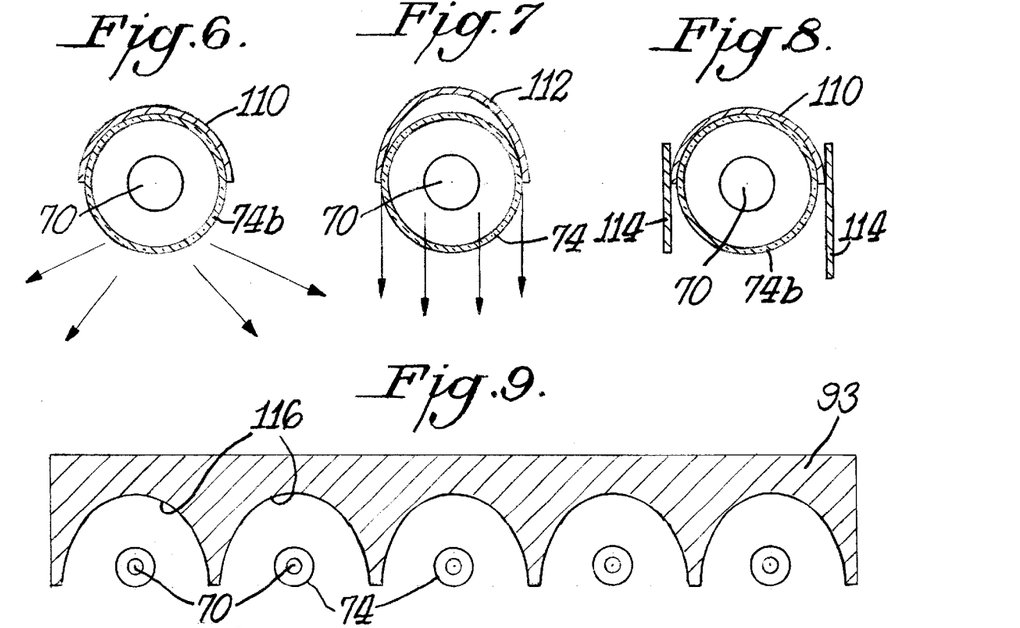
FIG. 6 is a section view of a heat lamp having a reflector for directing radiant energy.
FIG. 7 is a section view of a heat lamp having another arrangement for directing radiant energy to a semiconductor wafer in a rapid thermal processing system.
FIG. 8 is a section view of a heat lamp with yet another arrangement of a reflector for directing radiant energy to a semiconductor wafer in a rapid thermal processing system.
FIG. 9 is a cross-section view of an array of heat lamps embedded within the wall of a rapid thermal processing system chamber.

FIG. 6 shows in section view another embodiment in which a reflective coating 110 is applied to coat the outside surface of the transparent enclosure 74b surrounding the lamp bulb 70. Coating the outside surface directs radiant energy toward the wafer in the chamber 62, but with a different pattern than that produced when a coating 106 is applied to the inner surface of the transparent enclosure 74a (shown in FIG. 4).

A parabolic reflector 112 may be provided adjacent to the transparent enclosure 74 surrounding the bulb 70. As shown in FIG. 7, the parabolic reflector 112 serves to direct emitted radiation toward the wafer in straighter, more parallel paths, as compared to the reflective coating 110 applied to the outside surface of the transparent enclosure in FIG. 6, which reflects radiation in more divergent paths. Parabolic reflectors that direct emitted radiation toward the wafer in straighter, more parallel paths are preferred.

The benefits of straighter, more parallel paths for radiation may be obtained even when the reflective coating 110 is applied to the outer surface of the transparent enclosure 74b by introducing straight reflectors 114 adjacent to the transparent enclosure 74b as shown in FIG. 8. The straight reflectors 114 in combination with the reflective coating serve to direct the emitted radiation toward the semiconductor wafer. When the reflectors 114 are disposed between adjacent transparent enclosures in an array of enclosed lamps, the reflective surfaces of the reflectors 114 redirect some divergent radiation rays toward the wafer 64 in the chamber 62.

The top and bottom walls of the apparatus 60 or 90 alternatively may be formed as one or a series of channel-like cavities of parabolic reflective shapes 116, as shown best in FIG. 9. FIG. 9 is a cross section of taken from an end elevation of the upper portion of a chamber. In such an embodiment, each lamp 70 enclosed within a transparent enclosure 74 is held within a parabolic channel 116 formed within the chamber wall 93. With fewer separate parts for assembly, this embodiment may produce fewer contaminants than when the reflective structure is formed from separate parts or separate coatings associated with the transparent enclosures around the lamps. In addition, the openings of the parabolic channels 116 may also be covered with an optically transparent window (not shown in FIG. 9).

The foregoing embodiments, which provide for individual sealing of linear lamps with optically transparent enclosures, such as quartz tubes, eliminate the thicker and expensive quartz plates or windows used in conventional systems. Moreover, the optically transparent enclosures around the lamps can have cross-sectional shapes that improve the ability of the enclosures to withstand higher atmospheric pressures. For example, circular or parabolic cross-sectional shapes can withstand greater pressures than other cross sectional shapes with flatter surfaces. Nevertheless, other cross sectional shapes may also be used depending on the extent of the vacuum drawn or pressure differential between the chamber interior and exterior.

Figure 10A:
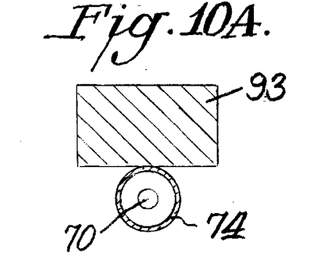
FIG. 10A is a section view of the heat lamp and quartz enclosure supported on the chamber wall of a rapid thermal processing system.
Figure 10B:
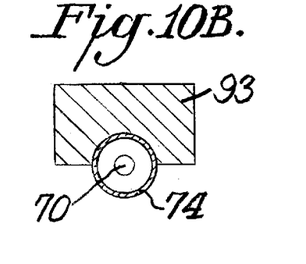
FIG. 10B is a section view of the quartz enclosed heat lamp in an alternate arrangement partially embedded in the chamber wall.
Figure 10C:
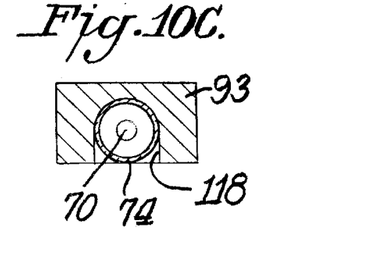
FIG. 10C is a section view of the quartz enclosed heat lamp in yet another alternate arrangement completely embedded in a cavity in the chamber wall.

FIGS. 10A–10F illustrate various embodiments for supporting a linear lamp 70 on or within the wall 93 of the chamber 62. FIG. 10A shows a bulb 70 surrounded by a quartz tube 74 and positioned closely adjacent to the side wall 93 of the chamber. Alternatively, FIG. 10B shows a bulb 70 surrounded by a quartz tube 74, wherein the tube is embedded partially within a cavity formed within the sidewall 93 of the chamber. As yet another alternative, FIG. 10C shows a bulb 70 surrounded by a quartz tube 74, wherein the tube is completely embedded within an arcuate cavity 118 formed within the sidewall 93 of the chamber. The arcuate cavity 118 has a depth sufficient to hold the entire tube 74.

Figure 10D:
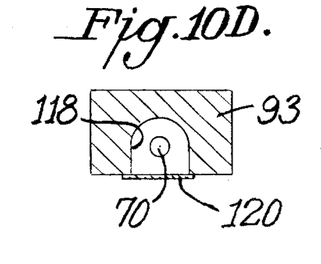
FIG. 10D is a section view of the heat lamp embedded within a cavity in the chamber wall and with a quartz window covering an opening to the cavity.
Figure 10E:
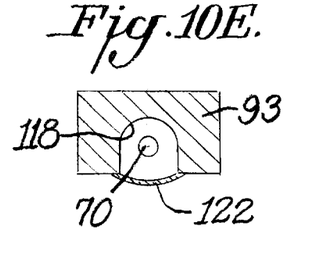
FIG. 10E is a section view of the heat lamp embedded in the chamber wall and having a lens for controlling dispersion of radiant energy emitted from the lamp.

In FIG. 10D the bulb 70 is held within a cavity 118 with an arcuate base. The opening of the cavity 118 is sealed with a flat cover 120 formed of optically transparent material, such as quartz. In such embodiment, there is no tube enclosing the bulb, but the bulb is isolated from the interior of the chamber by the cover 120. As an alternate to this approach, in FIG. 10E, the bulb 70 is held within a cavity 118 with an arcuate base formed within the wall 93 of the chamber, and a curved cover 122 of transparent material, such as quartz, seals the cavity opening. The curved cover 122 is preferably shaped as a convexly curved lens, to help focus and direct radiant energy from the lamp bulb 70 to the wafer held within the chamber.

Figure 10F:
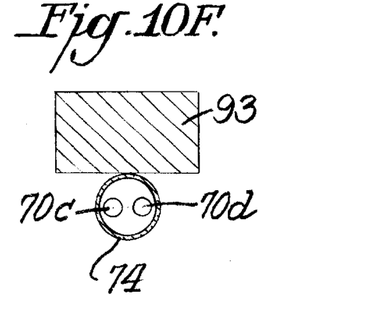
FIG. 10F is a section view of multiple lamps within a single quartz enclosure supported on the chamber wall.

Further efficiencies may result by enclosing multiple lamp bulbs within a single transparent enclosure. FIG. 10F shows bulbs 70c and 70d enclosed within quartz tube 74. The tube 74 is positioned closely adjacent the wall 93 of the chamber. Multiple lamps in a lamp array may be used as a heating source in the RTP system, but the benefits of the invention do not require a one to one relationship between the transparent enclosure and the bulb surrounded by such enclosure.

Figure 12:
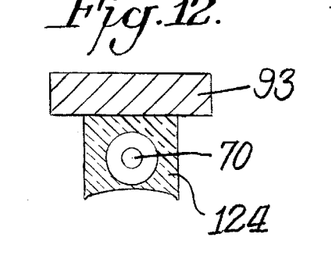
FIG. 12 is a section view of a heat lamp in a diverging quartz lens.

Rather than a tube-like structure, the optically transparent enclosure may be formed in other geometric shapes with varying cross-sections. For example, in FIG. 12, the bulb 70 may be held within a cavity formed within a solid piece 124 of an optically transparent material. The solid piece is attached to the wall 93 of the chamber, and has been shaped on one side to form a concavely curved lens to help direct and focus radiant energy emitted by the bulb 70.

Figure 13:
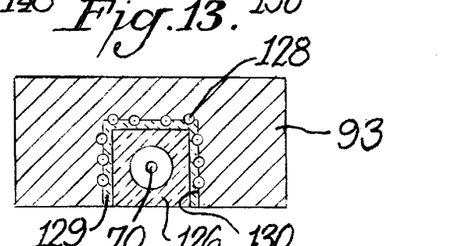
FIG. 13 is a section view of an alternate embodiment having a lamp within a quartz enclosure surrounded by a cooling source and embedded in a cavity in the chamber wall.

In yet another embodiment shown in FIG. 13, a solid block 126 of optically transparent material is held within a cavity 130 formed within the wall 93 of the chamber. A bulb 70 is held within a hollow portion of the solid block. The cooling channels 128 are provided within the cavity 130 and around the solid block 126 to permit flow of a cooling fluid, such as liquid or gas, to help to cool the block 126 and the lamp bulb 70. Preferably, the cooling channels 128 are held within a potting or sealing material 129 that seals the block 126 within the cavity 130.

Figure 14:
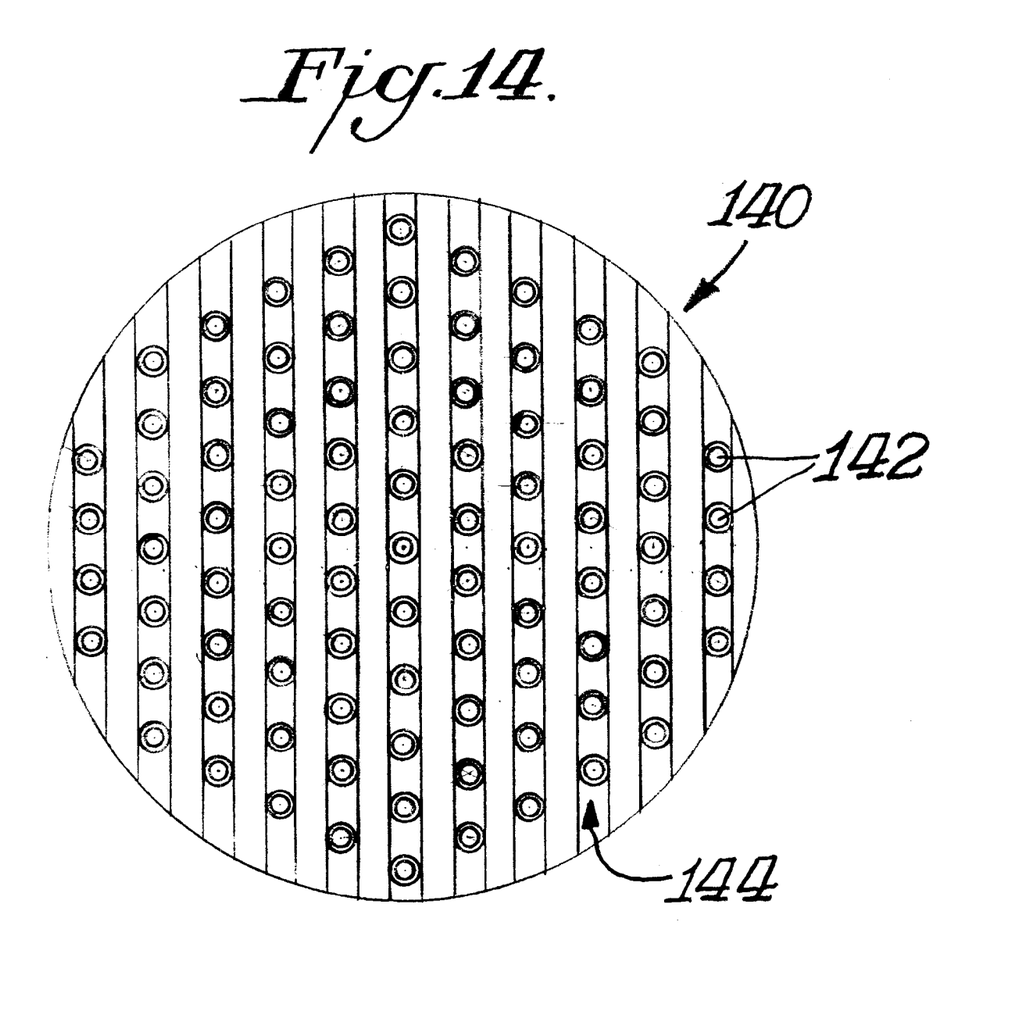
FIG. 14 is a bottom plan view of the chamber wall of an alternate rapid thermal processing system according to the invention showing point lamps held within channels in the chamber wall, wherein said channels are covered with optically transparent enclosures.

The principle of the invention can be equally applied to point lamps, rather than the linear lamps shown in the embodiments of FIGS. 2 and 3. The top wall 144 of an RTP system 140 that uses point lamps 142 as the heating source is shown in FIG. 14. In such an embodiment, the bulbs 142 are held within sockets so that the bulb portion extends perpendicularly to the semiconductor substrate, such as a semiconductor wafer, held within a chamber for processing. As shown in FIG. 14, the bulbs are aligned in rows and held within troughs. As one embodiment of the invention using an RTP system 140 with point lamps 142, strips of transparent optical enclosure material (not shown) cover the troughs holding the bulbs to isolate the bulbs from the chamber holding the wafer to be processed.

Figure 11A:
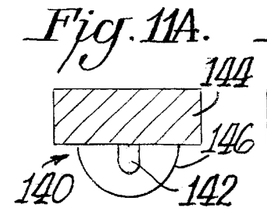
FIG. 11A is a section view of a point lamp enclosed by a quartz lens.
Figures 11B, 11C:
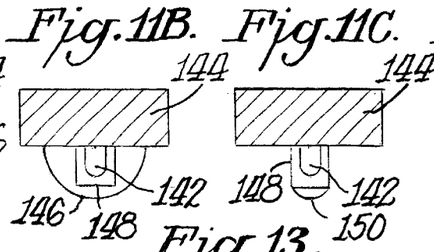
FIG. 11B is a section view of a lamp embedded in a light pipe and enclosed by a quartz lens.
FIG. 11C is a section view of a lamp within a light pipe and having a lens at the distal end of the light pipe.

Alternatively, as shown in FIG. 11A, each individual lamp bulb 142 held within a socket (not shown) in the wall 144 can be enclosed within an optically transparent enclosure 146 to isolate the lamp 142 from the interior of the chamber. To help direct radiant energy emitted from the lamp bulb 142 toward the wafer to be processed, the bulb 142 may be held within a light pipe 148, and the bulb and light pipe together enclosed within an optically transparent enclosure as shown in FIG. 11B. In FIGS. 11A and 11B, the optically transparent enclosure 146 has a curved or parabolic shape to better withstand pressures and forces thereupon when the pressure is changed within the chamber.

Figure 11D:
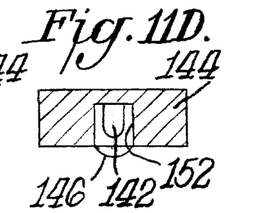
FIG. 11D is a section view of an alternate arrangement with a lamp embedded in a cavity in the chamber wall and surrounded by a quartz lens.

FIG. 11C shows the arrangement where an individual point lamp 142 is enclosed within a light pipe 148, wherein the proximal end of the light pipe 148 is attached to the wall 144 of the chamber. The distal end of the light pipe 148 is then enclosed with a curved or parabolic-shaped optically transparent enclosure 150 to seal the cavity formed by the light pipe and the enclosure and isolate bulb 142 from the wafer to prevent contamination from the bulb from reaching the wafer. In FIG. 11D, the point lamp 142 is held within a cavity or recess 152 within the wall 144 of the chamber. A smaller amount of quartz or other optically transparent material may be used in the curved or parabolic-shaped cover 146 to cover the cavity opening and isolate the bulb from the wafer to be processed.

While each of the foregoing embodiments of FIGS. 11A–D is shown with a curved quartz enclosure around the point lights 142 or point lights 142 in combination with a light pipe 148, it is of course possible to locate each of the bulbs within a recess or cavity in the chamber wall 144, and provide a single flat covering of quartz to seal each of the lamps against the pressure differential within enclosure.

The foregoing examples for controlling the dispersion of radiant heat energy from the lamps 70, 72, 142 are exemplary only. It is clear that a judicious selection of the lamps, reflective coatings, and lens surfaces will provide an even higher degree of control over radiant light into the processing chamber. The foregoing illustrations and descriptions of the preferred embodiments have shown these relationships as fixed. Nevertheless, they may be augmented by positioning devices which move the radiant lamps with respect to reflective surfaces and lenses. While the positions of these elements for controlling light/energy dispersion from the lamps has been described in the context of uniform light distribution over the interior surface of a wafer held within the chamber, such as chamber 62 or chamber 91, it is clear that the lamps and lamp arrays may be positioned to control the temperature profile within the enclosure.

Figure 15:
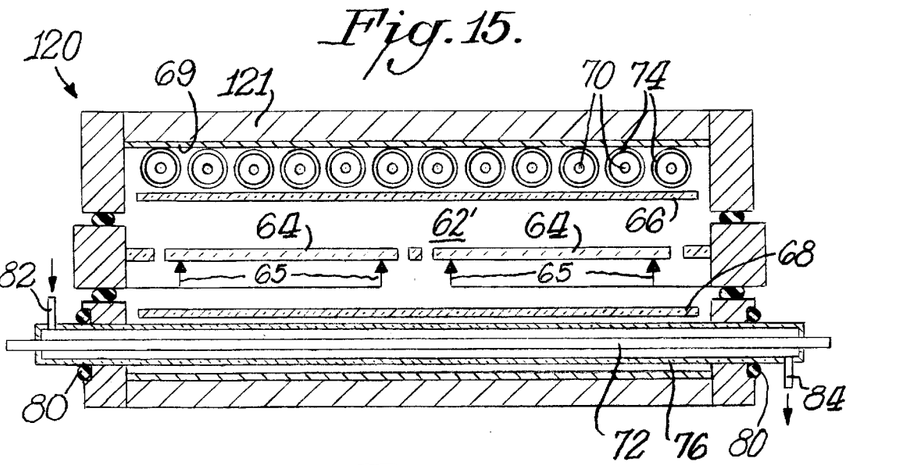
FIG. 15 is a section view of another alternate rapid thermal processing system in accordance with a preferred embodiment of the invention, showing two wafers held within the chamber.

Another alternate embodiment of the invention is shown in FIG. 15. In this embodiment, throughput is increased by placing two semiconductor wafers 64 onto wafer holders 65 within the chamber for simultaneous processing. Optically transparent liners 66 and 68, which may be quartz, do not form a pressure sealing surface with the chamber 62', but are supported within the chamber 62' so that the pressure is equalized on each side of the liners 66 and 68. First and second arrays of light sources, such as tungsten halogen heating lamps or Xenon arc lamps, are provided along the top and bottom of the chamber 62', i.e., above and below the wafer supports 65. The arrays of light sources along the top and bottom of the chamber 62' supply direct radiant heat to the wafers 64 as the wafers are held on the wafer supports 65. Each light source includes a linear lamp 70, 72 within an optically transparent enclosure (such as a quartz tube) 74, 76 on the top and bottom of chamber 62'. The quartz tubes 74, 76 individually surround each lamp 70, 72, and are sealed to the sidewalls of chamber 62' with seals 78, 80, thus maintaining both the area surrounding the quartz tubes 74, 76 and the remaining portion of the chamber 62 at the same pressure, preferably under vacuum. The lamps 70 in the upper array are arranged in a direction perpendicular to the lamps 72 in the lower array.

Individual cooling channels having an inlet 82 and an outlet 84 circulate cooling fluid, such as a liquid like water or a cooling oil, or a gas with suitable thermal conductivity like air, or a mixture of air and helium or hydrogen, through each quartz tube 74, 76 to cool the lamps 70, 72. The cooling fluid may have light refractive properties, and the path of flow of the cooling fluid may be designed to direct radiant heat or light emitted from the lamp bulbs 70, 72 toward the semiconductor wafer 64.

The top and bottom walls 91, 93 of the chamber 62 may be coated with a reflective coating 69, such as metallic gold or other infrared reflective coatings, such as $TiO_2$ and $Al_2O_3$.

As shown in FIG. 15, the chamber 62' has first and second arrays of quartz enclosures 74, 76, with each quartz enclosure containing a respective lamp 70, 72. The quartz enclosures 74, 76, and liners 66, 68, help to isolate the lamp bulbs from the chamber 62 so as to maintain the inner portion of the chamber 62 that houses the wafers during RTP processing free from contaminants without introducing large thermal masses between the light source(s) and the wafers.

Figure 16:
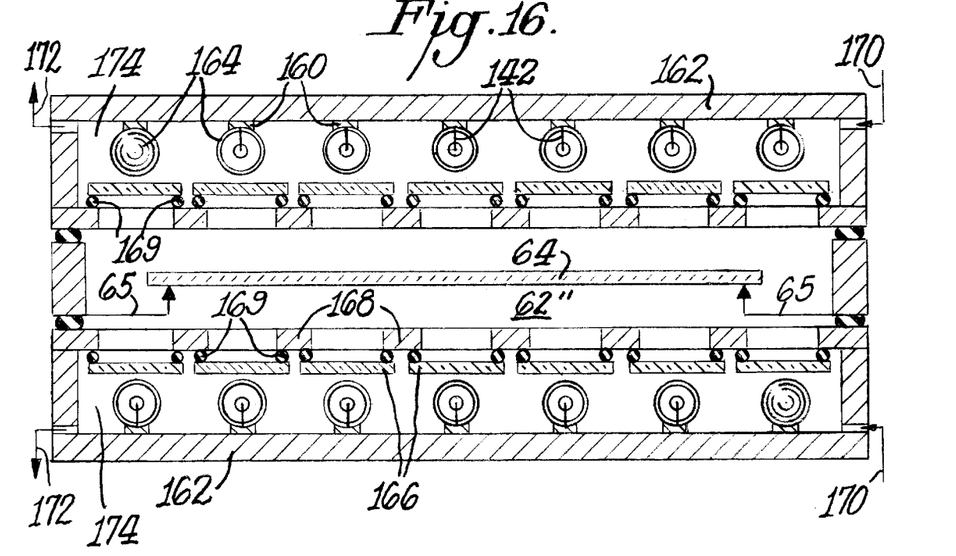
FIG. 16 is a section view of yet another alternate rapid thermal processing system in accordance with a preferred embodiment of the invention, showing a series of optically transparent liners in combination with a series of point-source heating lamps.

FIG. 16 shows yet another alternate embodiment of the apparatus, in which a plurality of point lamps 142 held within sockets 160 mounted in the outer walls 162 of the chamber 62" are positioned to direct radiant energy toward a wafer 64 held on wafer supports 65 within the chamber 62". The point lamps 142 preferably are surrounded by quartz envelopes 164 to minimize emission of contaminates. In addition, a series of optically transparent liners 166, preferably of quartz, are placed over openings in the inner wall 168 of the chamber 62" to further shield the point lamps 142 from the wafer 64 held within the chamber 62". The liners 166 are sealed to the inner wall 168 with seals 169. Preferably, channels 170, 172 formed in the chamber walls permit cooling fluid, such as a gas, to be circulated past the point lamps 142 to cool the lamps 142. These channels 170, 172 also permit gases to be introduced into and removed from the chamber 62" to help stabilize or equalize the pressure in the portions 174 of the chamber 62" enclosing the point lamps 142 and the portion of the chamber 62" enclosing the wafer 64 for processing.

The invention also comprises such embodiments in which features of the above mentioned embodiments are exchanged and/or combined in whole or in part.

The foregoing description of the invention illustrates and describes the preferred embodiments of the invention. Nevertheless, it is to be understood that the invention is capable of use in various other combinations, modifications, and environments and is capable of changes or modifications within the scope of the inventive concept as expressed herein, commensurate with the above teachings and/or the skill or knowledge of the relevant art. The description is not intended to limit the invention to the form disclosed herein. Alternate embodiments apparent to those of skilled in the art are to be included within the scope of the appended claims.

What is claimed is:

1. An apparatus for rapid thermal processing of a semiconductor substrate, comprising:

a chamber for providing a controlled pressure environment into which the semiconductor substrate is introduced, said chamber having a first wall;

a heating lamp supported along at least said first wall of said chamber; and an optically transparent envelope isolating the heating lamp from said controlled pressure environment, said optically transparent envelope capable of transmitting radiant heat energy emitted from the lamp for heating said substrate during processing.

2. The apparatus according to claim 1, further comprising a plurality of heating lamps supported along at least said first wall of said chamber, each of said heating lamps having an associated optically transparent envelope isolating the heating lamp from said controlled pressure environment.

3. The apparatus according to claim 1, further comprising a cooling channel for supplying a cooling fluid to said optically transparent envelope for controlling the temperature of said heating lamp.

4. The apparatus according to claim 1, further comprising an optically transparent liner located between said heating lamp and said substrate.

5. The apparatus according to claim 4, further comprising means for equalizing the pressure on each side of said optically transparent liner.

6. The apparatus according to claim 1, further comprising a reflector associated with the heating lamp for directing said radiant heat energy toward said substrate.

7. The apparatus according to claim 2, wherein the plurality of heating lamps are arranged in first and second arrays and the first array is located on or adjacent to the first wall of said chamber, and the second array is located on or adjacent to a second wall of said chamber, wherein said first and second walls are opposite to one another.

8. The apparatus according to claim 1, wherein said optically transparent envelope has a surface facing said substrate which is formed as a lens for directing radiant heat energy toward said substrate.

9. The apparatus according to claim 1, wherein said optically transparent envelope is formed of quartz.

10. The apparatus according to claim 1, wherein the semiconductor substrate is a semiconductor wafer.

11. The apparatus according to claim 2, wherein the heating lamps have linear bulbs.

12. The apparatus according to claim 2, wherein the heating lamps have point bulbs.

13. A thermal processing system for processing semiconductor substrates comprising:

a chamber for providing a controlled pressure environment into which one or more semiconductor substrates are introduced, said chamber having a first wall; and a plurality of radiant heat lamps isolated from said controlled pressure environment by one or more optically transparent surfaces capable of transmitting radiant heat energy emitted by the lamps for heating said substrate during processing, each of said heat lamps having associated therewith a reflective surface that is adjacent to the heat lamps and spaced from the first wall for controllably directing radiant heat energy toward said semiconductor substrate or substrates, wherein the radiant heat lamps and the optically transparent surfaces are on a same side of the chamber as the first wall.

14. The system according to claim 13, wherein one or more of said heat lamps is at least partially embedded within a cavity in said chamber first wall, and has associated therewith a reflector on a surface of said lamp for directing said radiant heat energy toward said semiconductor substrate.

15. The system according to claim 13, wherein one or more of said lamps is contained within an optically transparent enclosure having a surface which comprises a lens facing said semiconductor substrate.

16. The system according to claim 15, wherein a reflective coating is applied onto an inside surface of said optically transparent enclosure.

17. The system according to claim 15, wherein a reflective coating is applied onto a surface of said lamp.

18. The system according to claim 13, wherein at least two of said lamps are contained within an optically transparent enclosure.

19. The system according to claim 13, wherein the plurality of heating lamps are arranged in first and second arrays and the first array is located on or adjacent to the first wall of said chamber and the second array is located on or adjacent to a second wall of said chamber, wherein said first and second walls are opposite to one another.

20. The system according to claim 19, wherein said plurality of heating lamps comprise first and second spaced apart linear arrays.

21. The system according to claim 20, wherein the lamps of said first and second linear arrays are positioned in parallel planes.

22. The system according to claim 20, wherein the lamps of said first and second linear arrays extend in a direction parallel to each other.

23. The system according to claim 13, wherein said lamps are at least partially enclosed within one or more cavities formed in the first wall of said chamber.

24. The system according to claim 13, wherein said lamps are at least partially enclosed within one or more cavities formed in the second wall of said chamber.

25. The system according to claim 23, further comprising cooling channels disposed in said cavity or cavities in said chamber wall.

26. The system according to claim 24, further comprising cooling channels disposed in said cavity or cavities in said chamber wall.

27. The system according to claim 13, wherein at least one semiconductor substrate is a semiconductor wafer.

28. The system according to claim 19, wherein each of said lamps in said first array is held within a parabolic cavity formed in the first wall of the chamber.

29. The system according to claim 19, wherein each of said lamps in said second array is held within a parabolic cavity formed in the second wall of the chamber.

30. The system according to claim 13, wherein said lamps are point lamps.

31. The system according to claim 13, wherein said lamps are linear lamps.

32. The apparatus according to claim 1, wherein the optically transparent envelope is exposed to the controlled pressure environment of the chamber.

33. The apparatus according to claim 1, wherein the heating lamp is a lamp bulb disposed within the optically transparent envelope.

34. The apparatus according to claim 1, wherein the envelope is a tube.

35. The system according to claim 13, wherein the optically transparent surfaces envelop the heat lamps and are exposed to the controlled pressure environment of the chamber.

36. An apparatus for thermal processing of a semiconductor substrate, comprising:

a chamber for providing a controlled pressure environment into which the semiconductor substrate is introduced, said chamber having a first wall;

a heating lamp extending along said first wall of said chamber;

an optically transparent envelope isolating the heating lamp from said controlled pressure environment, said optically transparent envelope capable of transmitting radiant heat energy emitted from the lamp for heating said substrate during processing; and at least one reflective surface for directing radiant heat energy toward said semiconductor substrate or substrates, the at least one reflective surface being either located within the optically transparent envelope or disposed at an outer surface of the envelope.

\* \* \* \* \*